(12) United States Patent
Chou

(10) Patent No.: US 6,235,644 B1
(45) Date of Patent: May 22, 2001

(54) METHOD OF IMPROVING ETCH BACK PROCESS

(75) Inventor: Hsiao-Pang Chou, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/183,853

(22) Filed: Oct. 30, 1998

(51) Int. Cl.$^7$ .......................... B44C 1/22; H01L 21/3065
(52) U.S. Cl. .......................... 438/734; 438/906; 438/963; 216/67
(58) Field of Search .......................... 438/720, 734, 438/963, 906; 216/67

(56) References Cited

U.S. PATENT DOCUMENTS

| | | | |
|---|---|---|---|
| 5,174,856 | * 12/1992 | Hwang et al. | 216/69 |
| 5,188,980 | * 2/1993 | Lai | 437/193 |
| 5,227,337 | * 7/1993 | Kadomura | 437/192 |
| 5,854,137 | * 12/1998 | Kuo | 438/714 |
| 5,915,202 | * 6/1999 | Lo et al. | 438/666 |
| 5,990,018 | * 11/1999 | Ho et al. | 438/723 |
| 6,051,505 | * 4/2000 | Chu et al. | 438/710 |

* cited by examiner

Primary Examiner—Randy Gulakowski
Assistant Examiner—Shamim Ahmed

(57) ABSTRACT

A method of improving an etch back process. A substrate having a metal layer formed thereon is provided. A main etching is performed over the metal layer to form an interconnect. A first over etching is performed over a metal residue left after the main etching. A gas flush and second over etch are performed.

24 Claims, 6 Drawing Sheets

METHOD OF IMPROVING ETCH BACK PROCESS

BACKGROUND OF THE INVENTION

1. Field of the Invention

The invention relates to a method of fabricating multilevel interconnects of a semiconductor device, and more particularly to a method of improving the etching process of metallization.

2. Description of the Related Art

In many semiconductor circuits with a high integration, a plug is formed as a multilevel interconnect in an integrated circuit, or an interconnect between devices. In a conventional process, after forming an inter-metal dielectric layer on a first wiring layer, a via hole is formed to penetrate through the inter-metal dielectric layer and the first wiring layer is exposed. A metal layer is formed on the inter-metal dielectric layer and fills the via. The metal layer is then etched back to form a plug for interconnection.

Due to the high melting point, the high thermal expansion coefficient equivalent to silicon, a moderate internal stress, and a very good step coverage by chemical vapour deposition, tungsten is a very common material used to form a plug. A process with etch back is commonly adapted to form a tungsten plug for multilevel interconnection in the industry.

A conventional etch back process of fabricating a tungsten plug includes two steps. The first one is a main etch step, the second one is an over etch step. The main etch is performed by dry etch after the deposition of the metal layer. The unwanted metal layer on the surface of the inter-metal dielectric layer is removed by main etch. Over etch is performed to remove the residue metal layer after the main etch to ensure that the unwanted metal layer is removed completely. A conventional method of forming a tungsten plug with etch back is introduced with the reference of FIG. 1A to FIG. 1E as follows.

Referring to FIG. 1A, a dielectric layer 102 is formed on a substrate 100 which comprises a metal oxide semiconductor (MOS) device and a first metal layer. Referring to FIG. 1B, by covering a photo-resist layer on the dielectric layer 102, using photolithography and etching, a via hole or a contact window 104 for connecting different metal layers is defined, and the first metal layer is exposed. Referring, FIG. 1C, a thin metal glue layer 106, such as a titanium layer, is formed on the exposed first metal layer and the dielectric layer 102. Using physical vapour deposition, a barrier layer 108, such as a titanium nitride layer, having a thickness of 800 Å to 1200 Å is formed on the metal glue layer 106. A refractory and good conductive second metal layer 100, for example, a tungsten layer is formed on the barrier layer 108 and fills the via hole 104. Referring to FIG. 1D, using the barrier layer 108 as an etch stop, the second metal layer 110 is etched back to form a metal plug 110a. Referring to FIG. 2, the etch back process normally includes two steps, a step of main etch 200 and a second step of over etch 202.

After the formation of the second metal layer, using a mixture of gases containing fluorine, for example, carbon fluoride and oxygen ($CF_4/O_2$), nitrogen trifluoride and oxygen ($NF_3/O_2$), or sulfur fluoride and oxygen ($SF_6/O_2$) as a reacting gas source, main etch, such as dry etch, is performed with the barrier layer 108 as an etch stop. The second metal layer 110 is etched back, and most of the second metal layer 110 on the dielectric layer 102 is removed to form a metal plug. Over etch is then performed to remove the metal residue on the dielectric layer 102. The metal layer to be etched is thus removed completely.

Referring to FIG. 1E, with the gas source during dry etch, both etch reaction and polymerised reaction occur. Etch reaction is a reaction between metal and the plasma particles produced by the gas source. The production of the etch reaction is a volatile gas. Thus, after dry etch, the metal layer is transformed into a volatile gas and vaporised from the surface. The particles produced by the gas source are reacted with each other and polymerised into polymer 114. The polymer 114 is then deposited over the substrate 100. The main reaction is the etch reaction during dry etch. Therefore, after dry etch, most of the second metal layer 110 on the dielectric layer 102 is removed, but some metal residue is left and covered by the polymer 114. An over etch is then performed to remove the metal residue for about 20 seconds to 30 seconds. However, since the residue metal is covered by the polymer 114, a very long time, for example, 20 seconds to 1 minute, or more than 1 minute, is consumed for over etch. Consequently, the barrier layer 108, the metal glue layer 106, and the tungsten plug are damaged by the very time consuming over etch process. The metal plug loss caused during over etch process may cause an open contact while connecting other metal layer.

For a structure having an uneven surface, a stringer is formed due to the ragged topography during main etch. For example, referring to FIG. 3, on a substrate 300 having a bird's beak structure 301, a stringer or a residue 304 is formed. Similarly, the stringer 304 is difficult to remove completely, even by over etch.

SUMMARY OF THE INVENTION

It is therefore an object of the invention to provide a method of improving etch back process for metal. The metal to be etch, and the polymer produced during etch process are completely removed without consuming a very long time for over etch.

To achieve these objects and advantages, and in accordance with the purpose of the invention, as embodied and broadly described herein, the invention is directed towards a method of improving an etch back process. A substrate having a metal layer formed thereon is provided. Main etch is performed over the metal layer to form an interconnect. First over is performed over a metal residue left after the main etch. Gas flush and second over etch are performed. The gas flush is performed by a consistent flow method, or a pump-purge method.

It is to be understood that both the foregoing general description and the following detailed description are exemplary and explanatory only and are not restrictive of the invention, as claimed.

DESCRIPTION OF THE PREFERRED EMBODIMENTS

Figure 4A:
FIG. 4A to FIG. 4D are cross sectional views of a process of fabricating an interconnect in a preferred embodiment according to the invention.

Referring to FIG. 4A, a dielectric layer 402, preferably comprising a one- or two-layered spin-on-glass sandwich type structure, is formed on a semiconductor substrate 400 having a MOS device (not shown on the figure) and a first metal layer (not shown on the figure) formed thereon. The sandwich type structure prevents the formation of voids in a dielectric layer during fabrication by chemical vapour deposition. Using plasma enhanced vapour deposition (PECVD) with tetra-ethyl-oxy-silicate (TEOS) as precursor, an oxide layer is formed as a first dielectric layer. After the formation of the first dielectric layer, a spin-on-glass layer is coated on the first dielectric layer. Being baked and cured, a second dielectric layer is formed on the spin-on-glass layer, and the dielectric layer 402 of a sandwich type structure is formed.

Figure 4B:
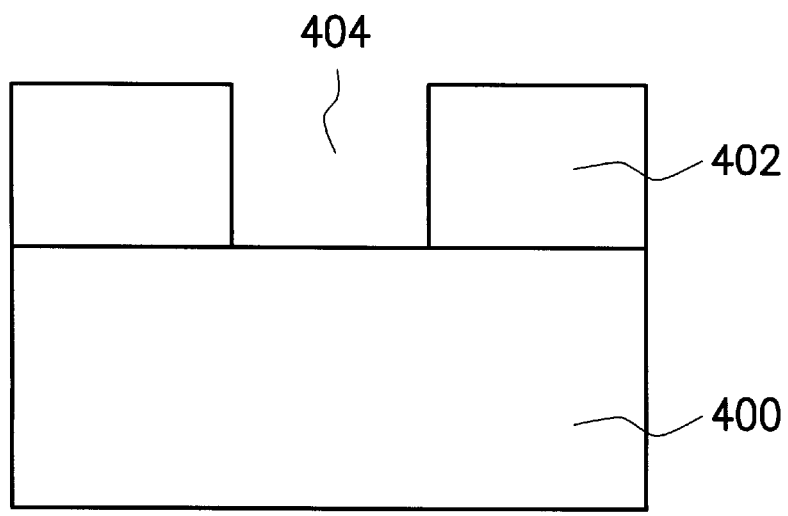

Referring FIG. 4B, using a mask and performing photolithography and etching to define an interconnecting channel, that is, a via hole or a contact window, for different metal layers, to expose the first metal layer.

Figure 4C:
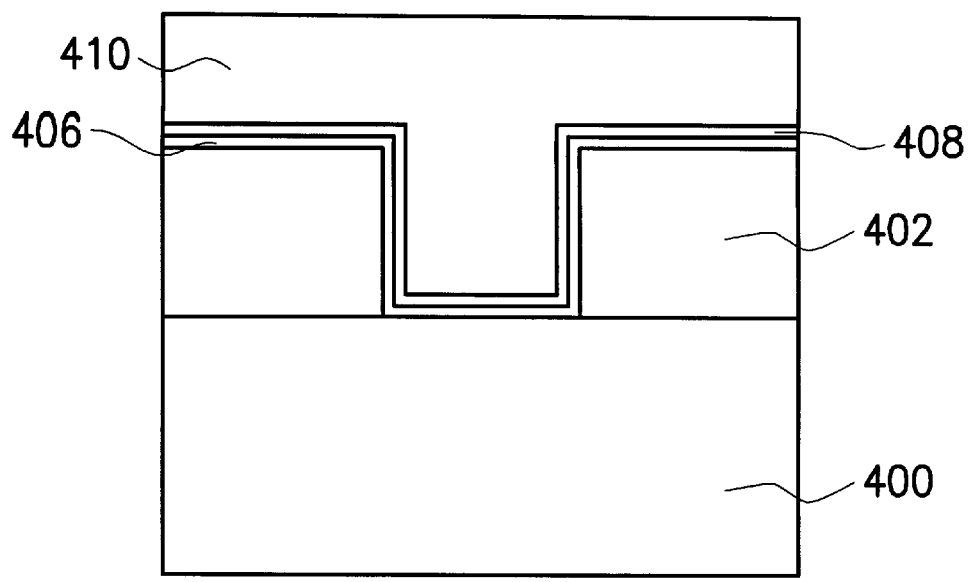

Referring to FIG. 4C, to improve the adhesion between the metal plug and other materials, a titanium nitride layer or a tungsten nitride layer is formed. In addition, by the difference of plasma spectra between metal and the titanium nitride layer or tungsten nitride layer, the titanium nitride layer or the titanium tungsten layer is also used as an etch stop. In the practical application of metallization process, titanium nitride is combined with a titanium layer as a form of Ti/TiN. Therefore, before the formation of a metal plug, a glue layer, such as a titanium layer is formed on the exposed first metal layer within via hole and the dielectric layer. A barrier layer 408 having a thickness of about 800 Å to 1200 Å is formed on the glue layer. A refractory and good conductive metal layer 410, such as a tungsten layer, is formed on the barrier layer 408, and fills the via hole. To obtain a better adhesion between the metal layer 310 and other material, the metal layer is formed by chemical vapour deposition under a pressure of 1 Torr to 100 Torr, at a temperature of 300° C. to 550° C. A thin nucleation layer of the metal layer is formed first, and a metal layer having a thickness of about 5000 Å to 10000 Å is then formed on the nucleation layer.

Figure 4D:
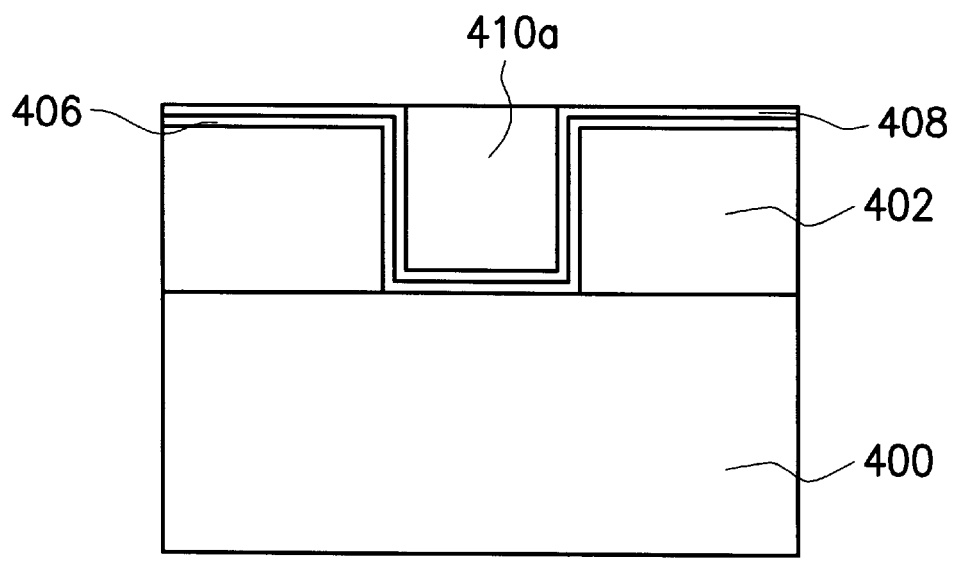
Figure 5:
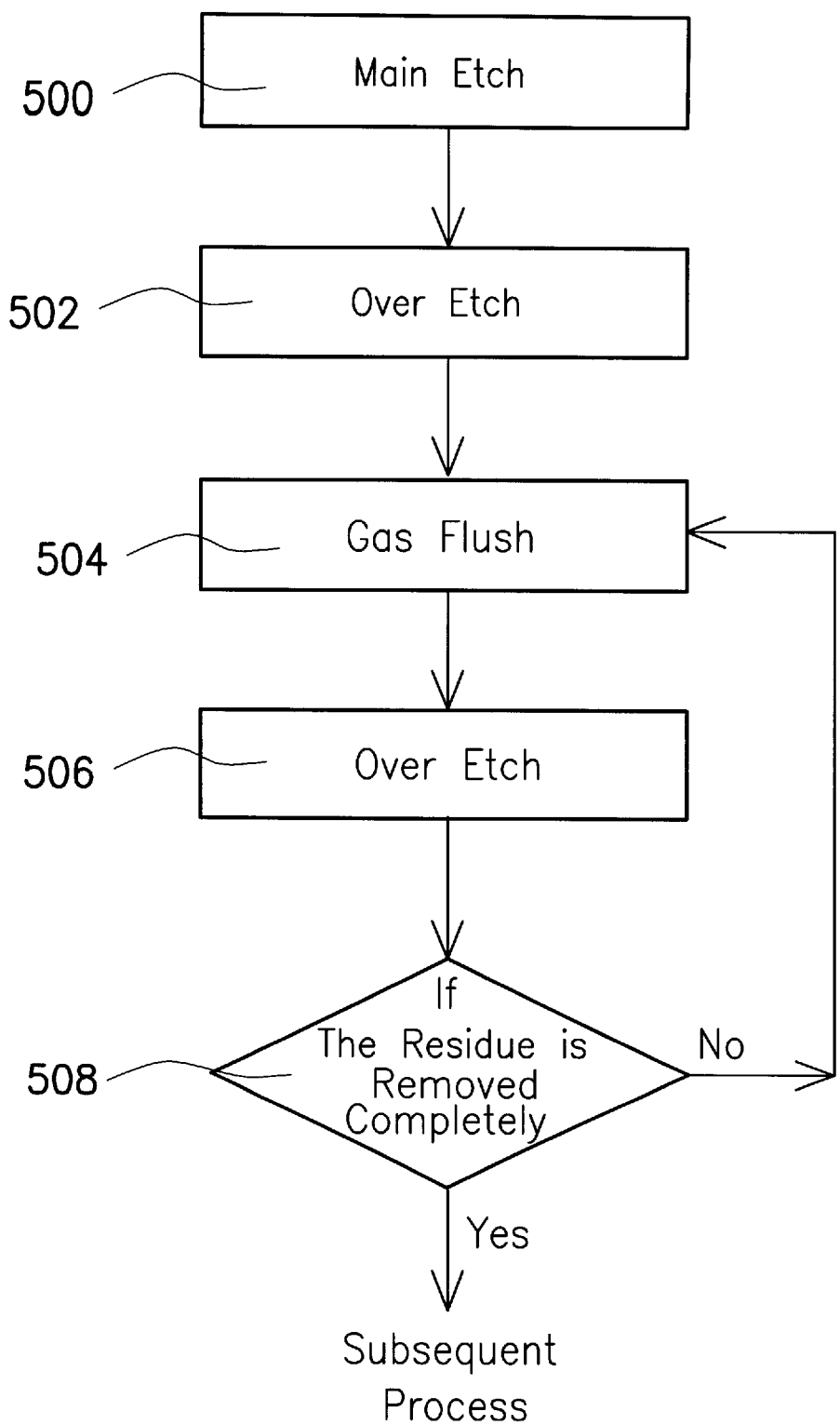
FIG. 5 is a flow chart of a method of fabricating an interconnect in a preferred embodiment according to the invention.

Referring to FIG. 4D and FIG. 5, after the formation of a metal layer 410, with a gas source containing fluorine, such as a mixture of carbon fluoride and oxygen, nitrogen fluoride and oxygen, or sulfur fluoride and oxygen, using barrier layer 406 as an etch stop, a main etching 500 is performed. The metal layer 410 is etched back through the main etching, and most of the metal layer 410 is removed to form a metal plug 410a. A first over etch process 502 is performed to remove the metal residue left after main etching 500. Different from the conventional process, the first over etching 502 is performed for only 1 second to 10 second, preferably 1 second to 3 seconds.

After the first over etching, a first gas flush process is performed. There are two methods available to perform the gas flush process. The first method is a consistent flow method, and the second method is pump-surge method. By the first method, that is, the consistent flow method, the power supply of the plasma is switched off after the first over etching, while the gas flow is supplied consistently. The metal residue is removed with the gas flow. In the second method, that is, the pump-purge method, after the first over etching, the power supply is switched off while the gas flow is evacuated to a state of almost vacuum (less than of $10^{-7}$ Torr) first, and then raised up to about 40 mTorr to 5 Torr. The metal residue is thus purged away. The gas flow is supplied in a direction parallel to the surface of the device in the above two methods. While removing the metal residue on the surface of the device by gas flow, structure like a metal plug having a profile perpendicular to the direction of the gas flow is not etched and damaged. Therefore, the plug loss is minimised, whereas the metal residue is removed easily. After the first gas flush process, a second over etching 506 is performed for about 1 to 10 seconds, preferably 1 second to 3 seconds. If the metal residue is not removed completely, the process goes back to gas flush 504 and over etch 506 iteratively, until the metal residue is removed completely.

Figure 1A:
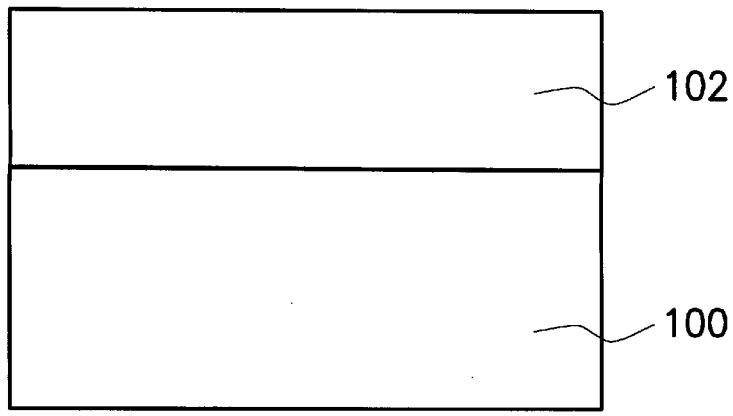
FIG. 1A to FIG. 1E are cross sectional views of a conventional process of fabricating an interconnect.
Figure 1B:
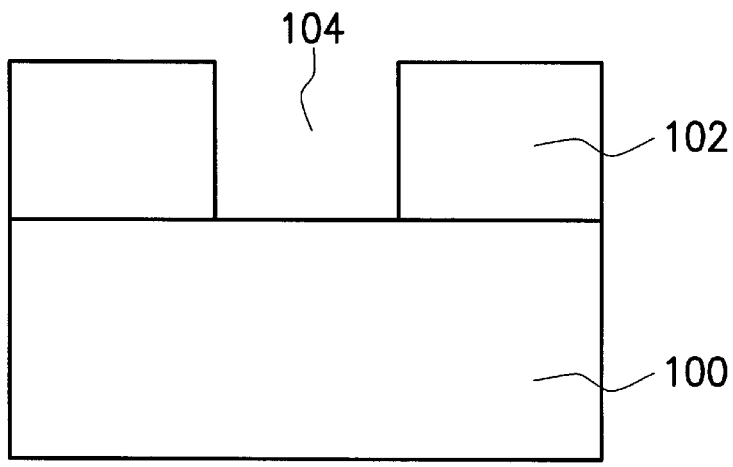
Figure 1C:
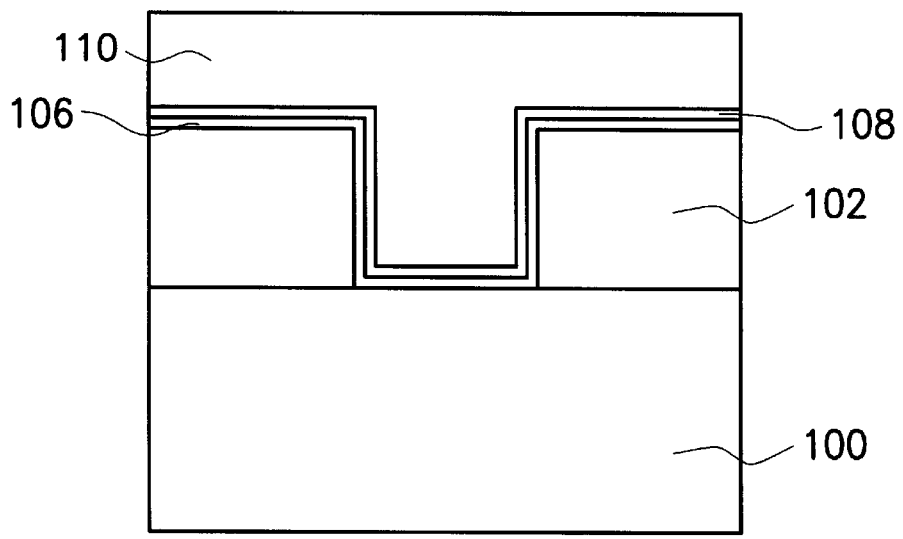
Figure 1D:
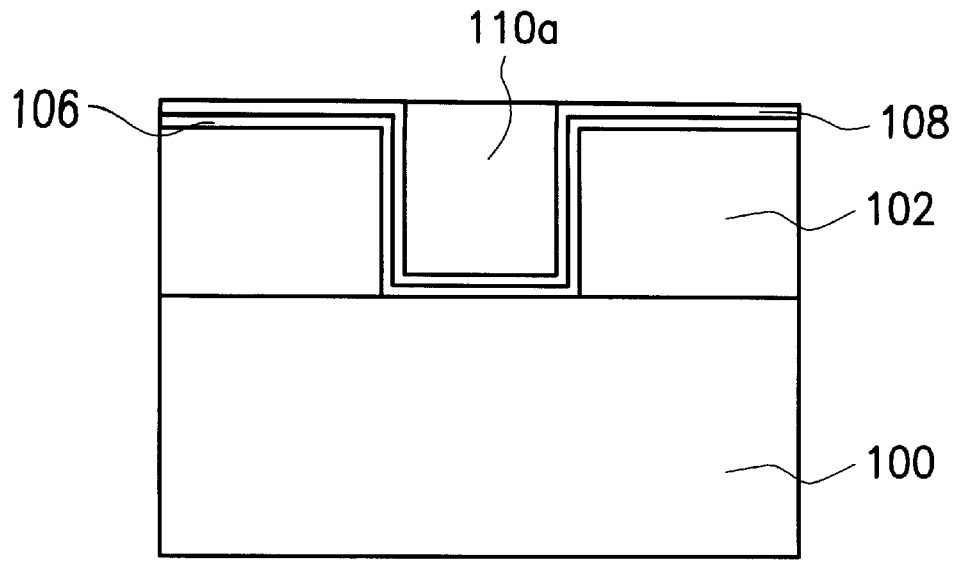
Figure 1E:
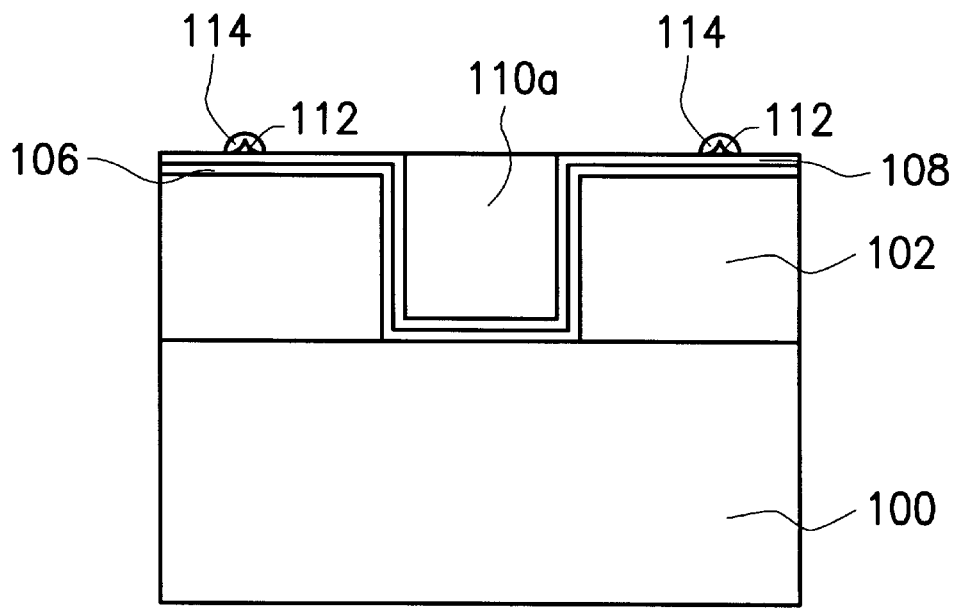
Figure 2:
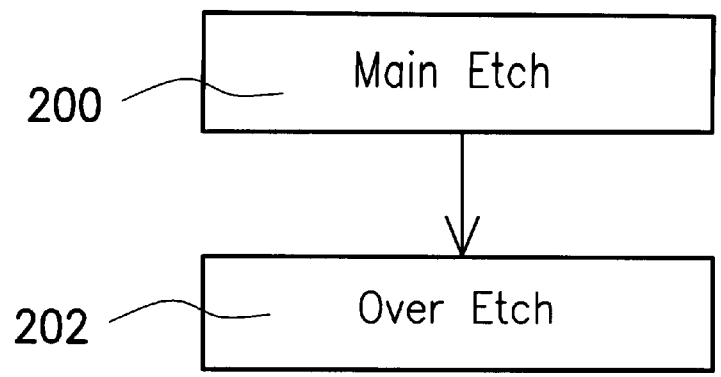
FIG. 2 is a flow chart of a conventional process of metal.
Figure 3:
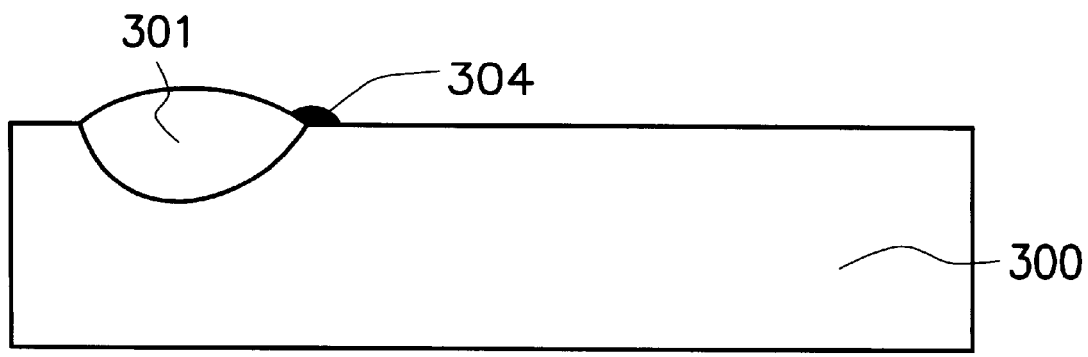
FIG. 3 is a cross sectional view of a stringer formed on a ragged surface by a conventional process.

In the above embodiment, an example of etching back a metal plug is represented. The same process is available to the application for the removal other structures, for example, the stringer as shown in FIG. 3.

The characteristics of the invention is that in the etch back process, over etching is performed in a shorter time to prevent the damage of the surface of the device, and a gas flush step is performed after over etching additionally. By the gas flush step, the metal residue is removed with the gas flow or purged away. Moreover, since the direction of the gas flow is parallel to the surface of the device, profile like a metal plug is not damage, and thus, the plug loss is minimised.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of improving an etch back process, comprising:
   providing a substrate having a metal layer formed thereon;
   performing a main etching with a reactive gas source over the metal layer to form an interconnect;
   performing a first over etching over a metal residue left after the main etching;
   performing a gas flush by switching off a power supply for the reactive gas source and supplying the reactive gas source in a direction parallel to the substrate for removing the metal residue; and
   performing a second over etching.

2. The method according to claim 1, after the first over etch, further performing additional gas flush and over etching iteratively until the metal residue is removed completely.

3. The method according to claim 1, wherein the metal layer is a tungsten layer.

4. The method according to claim 1, wherein the main etching is performed by using a gas containing fluorine as a reactive gas source.

5. The method according to claim 1, wherein the reactive gas source is a mixture of carbon fluoride and oxygen.

6. The method according to claim 1, wherein the reactive gas source is a mixture of nitrogen fluoride and oxygen.

7. The method according to claim 1, wherein the reactive gas source is a mixture of sulfur fluoride and oxygen.

8. The method according to claim 1, wherein after the main etching, the first over etching is in situ performed.

9. The method according to claim 1, wherein the first over etching and the second over etching are performed for about 1 seconds to 10 seconds.

10. The method according to claim 9, wherein the first over etching and the second etching are performed for about 1 seconds to 3 seconds.

11. The method according to claim 1, wherein the gas flush is performed by a method of consistent flow under conditions:

switching off a power supply of the reactive gas source; and supplying a consistent flow of the reactive gas source.

12. The method according to claim 1, wherein the gas flush is performed by a pump-purge method comprising:

switching off the power supply of the reactive gas source;

evacuating the reactive gas source to a state of almost vacuum;

pumping the reactive gas source to a pressure of about 40 mTorr to 5 Torr; and reducing the pressure of the reactive gas source.

13. A method of improving an etch back process, comprising:

providing a substrate having a dielectric layer formed thereon;

patterning dielectric layer to form a contact window penetrating through the dielectric layer and exposing the substrate;

forming a metal layer over the substrate;

performing a main etching with a reactive gas source to form a metal plug within the contact window;

performing a first over etching over a metal residue left after the main etching;

performing a gas flush by switching off a power supply for the reactive gas source and supplying the reactive gas source in a direction parallel to the substrate for removing the metal residue; and performing a second over etching.

14. The method according to claim 13, after the first over etching, further performing additional gas flush and over etching iteratively until the metal residue is removed completely.

15. The method according to claim 13, wherein the metal layer is a tungsten layer.

16. The method according to claim 13, wherein the main etch is performed by using a gas source containing fluorine as a reactive gas source.

17. The method according to claim 13, wherein the reactive gas source is a mixture of carbon fluoride and oxygen.

18. The method according to claim 13, wherein the reactive gas source is a mixture of nitrogen fluoride and oxygen.

19. The method according to claim 13, wherein the reactive gas source is a mixture of sulfur fluoride and oxygen.

20. The method according to claim 13, wherein the first over etching and the second over etching are performed for about 1 to 10 seconds.

21. The method according to claim 20, wherein the first over etching and the second etching are performed for about 1 to 3 seconds.

22. The method according to claim 1, wherein after the main etching, the first over etching is in situ performed.

23. The method according to claim 1, wherein the gas flush is performed by a method of consistent flow under conditions:

switching off a power supply of the reactive gas source; and supplying a consistent flow of the reactive gas source.

24. The method according to claim 1, wherein the gas flush is performed by a pump-purge method comprising:

switching off the power supply of the reactive gas source;

evacuating the reactive gas source to a state of almost vacuum;

pumping the reactive gas source to a pressure of about 40 mTorr to 5 Torr; and reducing the pressure of the reactive gas source.

* * * * *